United States Patent [19]

Furuki

[11] Patent Number: 5,258,666
[45] Date of Patent: Nov. 2, 1993

[54] CMOS CLOCKED LOGIC DECODER

[75] Inventor: Katsuya Furuki, Tokyo, Japan

[73] Assignee: NEC Corporation, Japan

[21] Appl. No.: 827,359

[22] Filed: Jan. 29, 1992

[30] Foreign Application Priority Data

Feb. 1, 1991 [JP] Japan .................................... 3-11812

[51] Int. Cl.$^5$ ................. H03K 19/094; H03K 19/096
[52] U.S. Cl. .................................... 307/449; 307/452; 307/481
[58] Field of Search ............... 307/452, 481, 482, 463, 307/449, 4

[56] References Cited

U.S. PATENT DOCUMENTS

| | | | |
|---|---|---|---|
| 3,665,473 | 5/1972 | Heimbigner | 307/449 |
| 3,796,893 | 3/1974 | Hoffman et al. | 307/449 |
| 4,040,015 | 8/1977 | Fukuda | 307/481 |
| 4,827,160 | 5/1989 | Okano | 307/449 |
| 5,015,882 | 5/1991 | Houston et al. | 307/481 |

Primary Examiner—Edward P. Westin
Assistant Examiner—Richard Roseen
Attorney, Agent, or Firm—Laff, Whitesel, Conte & Saret

[57] ABSTRACT

The present semiconductor logic circuit includes a first-stage logic circuit section comprising of a first precharging transistor, a first grounding transistor, and a first logic element and a second-stage logic circuit section comprising of a second precharging transistor, a second grounding transistor, and a second logic element. The first precharging transistor has the common terminal connected to a power terminal and receives a clock signal at the input terminal. The first grounding transistor has the common terminal connected to the ground and receives a clock signal at the input terminal. The first logic element has the grounding end connected to the output terminal of the first grounding transistor and the output end connected to the output terminal of the first precharging transistor. The second precharging transistor has the common terminal connected to a power terminal and the input terminal connected to the output end of the first logic element. The second grounding transistor has the common terminal connected to the ground and the input terminal connected to the output end of the first logic element. The second logic element has the grounding end connected to the output terminal of the second grounding transistor and the output end connected to the output terminal of the second precharging transistor.

9 Claims, 4 Drawing Sheets

CMOS CLOCKED LOGIC DECODER

BACKGROUNDS OF THE INVENTION

1. Field of the Invention

This invention relates to a semiconductor logic circuit comprising of two logic circuit sections, that is, a first-stage logic circuit section and a second-stage logic circuit section, and particularly, to a semiconductor logic circuit including dynamic logic elements.

2. Description of the Prior Art

A prior semiconductor logic circuit comprising of two logic circuit sections, that is, a first-stage logic circuit section and a second-stage logic circuit section, is briefly described below. The first-stage logic circuit section comprises of a first precharging transistor which is connected to a power terminal and turns on/off in response to a clock signal, a first grounding transistor which is connected to the ground and also turns on/off in response to a clock signal, and a first logic element which has the grounding end connected to the grounding transistor and the output end connected to the precharging transistor and performs a given logic operation on a first input signal to make the result available at the output end. The second-stage logic circuit section comprises of a second precharging transistor which is connected to a power terminal and turns on/off in response to a clock signal, a second grounding transistor which receives an output signal of the first logic element to turn on/off, a third grounding transistor which is connected to the ground and to the second grounding transistor in serial and receives a clock signal to turn on/off, and a second logic element which has the grounding end connected to the second grounding transistor and the output end connected to the second precharging transistor and performs a given logic operation on a second input signal to make the result available at the output end.

The operating speed of each logic element depends on the time required for dynamically held electric charges to be discharged by the transistors inside the logic element and the grounding transistor connected to the logic element.

Another prior semiconductor logic circuit includes two or more first-stage logic circuit sections. The outputs of those first-stage logic circuit sections are supplied to two or more second grounding transistors of a second-stage logic circuit section which includes two or more logic elements. A first precharging transistor for each of the first-stage logic circuit sections and a third grounding transistor of the second-stage logic circuit section receive a clock signal CLK.

The prior semiconductor logic circuits as described above require a large circuit to generate clock signals because a clock signal must be supplied to the precharging and grounding transistors of both the first-stage and the second-stage logic circuit sections. Because of the two serial-connected grounding transistors, the logic element of the second-stage logic circuit section takes a longer time to discharge electric charges, resulting in a lower operating speed of the second-stage logic circuit section.

SUMMARY OF THE INVENTION

The present invention has been developed to solve those problems described above and it is an object of the invention to provide a semiconductor logic circuit, which requires only a smaller circuit to generate clock signals and which can make the second-stage logic circuit section perform its operation at a higher speed.

The above object can be attained by a preferred embodiment of the present invention, wherein a semiconductor logic circuit includes a first-stage logic circuit section and a second-stage logic circuit section; the first-stage logic circuit section comprises of a first precharging transistor, a first grounding transistor, and a first logic element; the first precharging transistor has the common terminal connected to a power terminal and receives a clock signal at the input terminal; the first grounding transistor has the common terminal connected to the ground and receives a clock signal at the input terminal; the first logic element includes a number of transistors to receive first input signals at their input terminals and has the grounding end connected to the output terminal of the first grounding transistor and the output end connected to the output terminal of the first precharging transistor; the second-stage logic circuit section comprises of a second precharging transistor, a second grounding transistor, and a second logic element; the second precharging transistor has the common terminal connected to a power terminal and the input terminal connected to the output end of the first logic element; the second grounding transistor has the common terminal connected to the ground and the input terminal connected to the output end of the first logic element; and the second logic element includes a number of transistors to receive second input signals at their input terminals and has the grounding end connected to the output terminal of the second grounding transistor and the output end connected to the output terminal of the second precharging transistor.

According to the preferred embodiment, the first and second precharging transistors are P-channel FETs and the first and second grounding transistors are N-channel FETs.

In addition, the first-stage logic circuit section is provided with an inverter to invert an output signal of the first logic element, the output of the inverter is connected to the input terminal of the second precharging transistor in the second-stage logic circuit section, and the second-stage logic circuit section is provided with an inverter to invert an output signal of the second logic element.

Further, the second logic element of the second-stage logic circuit section is an AND circuit to make the AND of the output from the first-stage logic circuit section and the second input signals available at the output end. Alternatively, the second logic element of said second-stage logic circuit section is an OR circuit, and the output of said second-stage logic circuit section is AND logic between the output from said first-stage logic circuit section and the operation result from said second logic element.

According to another preferred embodiment, the present semiconductor logic circuit includes a number of first-stage logic circuit sections, a logic gate circuit, and a second-stage logic circuit section; each of the first-stage logic circuit sections comprises of a first precharging transistor, a first grounding transistor, and a first logic element; the first precharging transistor has the common terminal connected to a power terminal and receives a clock signal at the input terminal; the first grounding transistor has the common terminal connected to the ground and receives a clock signal at the input terminal; the first logic element includes a number of transistors to receive first input signals at their input terminals and has the grounding end connected to the output terminal of the first grounding transistor and the output end connected to the output terminal of the first precharging transistor; the logic gate circuit has the input connected to the output of the first logic element of each of the first-stage logic circuit sections; the second-stage logic circuit section comprises of a second precharging transistor, a number of second grounding transistors, and a number of second logic elements; the second precharging transistor has the common terminal connected to a power terminal and receives an output signal of the logic gate circuit at the input terminal; each of the second grounding transistors has the common terminal connected to the ground and the input terminal connected to the output end of the first logic element; and each of the second logic elements includes a number of transistors to receive second input signals at their input terminals and has the grounding end connected to the output terminal of the second grounding transistor and the output end connected to the output terminal of the second precharging transistor.

In addition, the first and second precharging transistors are P-channel FETs and the first and second grounding transistors are N-channel FETs.

Further, the first-stage logic circuit section is provided with an inverter to invert an output signal of the first logic element, the output of the inverter is connected to the input terminal of the second grounding transistor in the second-stage logic circuit section, and the second-stage logic circuit section is provided with an inverter to invert an output signal of the second logic element. Alternatively, the second logic elements of the second-stage logic circuit section are an AND circuit and an OR circuit.

Other objects and effects of the invention will become apparent from the following description of embodiments.

DESCRIPTION OF THE PREFERRED EMBODIMENT

Referring to FIGS. 1 through 6, a preferred embodiment of the present invention is described below in detail.

Figure 1:
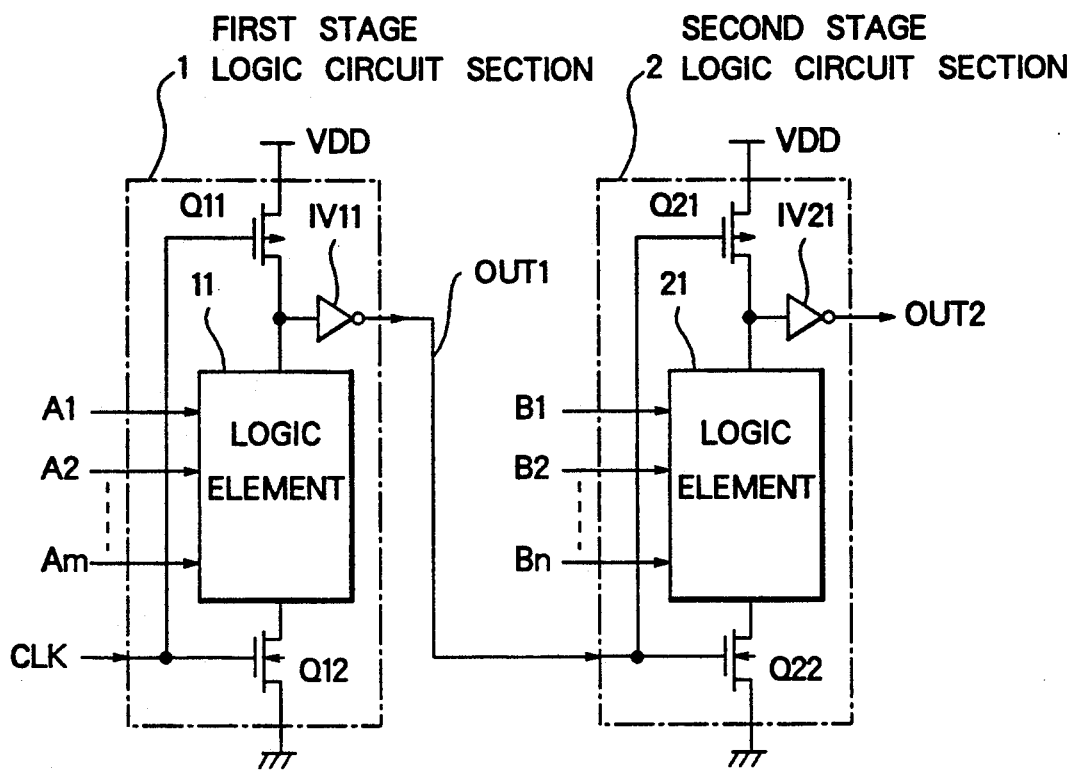
FIG. 1 is a block diagram showing the configuration of a semiconductor logic circuit according to an embodiment of the present invention.

FIG. 1 shows a semiconductor logic circuit according to an embodiment of the present invention. In the figure, the semiconductor logic circuit includes a first-stage logic circuit section 1 and a second-stage logic circuit section 2.

The first-stage logic circuit section 1 comprises of a logic element 11, a first precharging transistor Q11, a first grounding transistor Q12, and an inverter IV11. The precharging transistor Q11 and the grounding transistor Q12 are preferably metal oxide semiconductor field effect transistors (MOSFETs). According to the present embodiment, the precharging transistor Q11 is a P-channel MOSFET and the grounding transistor Q12 is an N-channel MOSFET.

The precharging transistor Q11 has the common terminal or the source connected to the power terminal of a supply voltage VDD and receives a clock signal CLK at the input terminal or the gate. The precharging transistor Q11 turns on/off in response to the clock signal CLK.

The grounding transistor Q12 has the source connected to the ground and receives a clock signal CLK at the gate. Similarly to the precharging transistor Q11, the grounding transistor Q12 turns on/off in response to the clock signal CLK.

The logic element 11 includes m number of transistors each having the gate to receive a first input signal A1, A2, ..., of Am, and is connected to the drain of the grounding transistor Q12 at the grounding end and to the drain of the transistor Q11 at the output end. The logic element 11 performs a given logic operation on the first input signal A1, A2, ..., or Am and makes the result available at the output end. The logic element 11 is, for example, an AND circuit, an OR circuit, or any of other logic circuits.

At the output end of the logic element 11, an inverter IV11 is provided to invert an output of the logic element 11 and the inverted output from the inverter IV11 is an output OUT1 of the first-stage logic circuit section 1.

The second-stage logic circuit section 2 comprises of a logic element 21, a second precharging transistor Q21, a second grounding transistor Q22, and an inverter IV21. Similarly to the first-stage logic circuit section 1, the precharging transistor Q21 and the grounding transistor Q22 are a P-channel MOSFET and an N-channel MOSFET, respectively.

The precharging transistor Q21 has the source connected to the power terminal of a supply voltage VDD and the gate connected to the output OUT1 of the first-stage logic circuit section 1. The precharging transistor Q21 turns on/off in response to an output signal at the output OUT1.

The grounding transistor Q22 has the source connected to the ground and the gate connected to the output OUT1 of the first-stage logic circuit section 1. Similarly to the precharging transistor Q21, the grounding transistor Q22 turns on/off in response to an output signal at the output OUT1.

The logic element 21 includes n number of transistors each having the gate to receive a second input signal B1, B2, ..., or Bn, and is connected to the drain of the grounding transistor Q22 at the grounding end and to the drain of the precharging transistor Q21 at the output end. The logic element 21 performs a given logic operation on the second input signal B1, B2, ..., or Bn and makes the result available at the output end. The logic element 21 is, for example, an AND circuit, an OR circuit, or any of other logic circuits.

At the output end of the logic element 21, an inverter IV21 is provided to invert an output of the logic element 21 and the inverted output from the inverter IV21 is an output OUT2 of the second-stage logic circuit section 2.

The semiconductor logic circuit according to the present embodiment differs from the prior semiconductor logic circuits described above in that the source of the grounding transistor Q22 is connected directly to the ground to eliminate the necessity of providing a third grounding transistor in the second-stage logic circuit section 2 and that the gate of the second precharging transistor Q21 is connected to the output OUT1 of the first-stage logic circuit section 1 similarly to the grounding transistor Q22.

Figure 2:
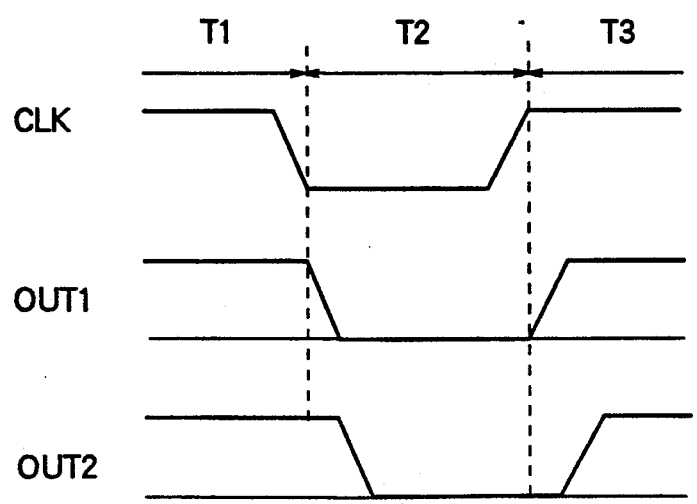
FIG. 2 is a timing chart for explaining the operations of the semiconductor logic circuit shown in FIG. 1.

Referring to the timing chart for the clock signal CLK and the outputs OUT1 and OUT2 shown in FIG. 2, the operations of the present embodiment is described below.

During the time T2, that is, while the clock signal CLK remains low, the grounding transistor Q12 is off and the precharging transistor Q11 is on. Thus, regardless of the input signals A1, A2, ..., and Am, the output OUT1 of the first-stage logic circuit section 1 is always low due to the existence of the inverter IV11. While the output OUT1 is low, the precharging transistor Q21 of the second-stage logic circuit section 2 is on and the grounding transistor Q22 is off. Thus, regardless of the second input signals B1, B2, ..., and Bn, the output OUT2 of the second-stage logic circuit section 2 is low due to the existence of the inverter IV21.

When the clock signal CLK goes to high, the output OUT1 of the first-stage logic circuit section 1 remains low or goes to high, depending on the state of the input signals A1 through Am supplied to the logic element 11.

If the output OUT1 is low, the output OUT2 of the second-stage logic circuit section 2 remains low because the precharging transistor Q21 is on and the grounding transistor Q22 is off.

If the output OUT1 goes to high, the precharging transistor Q21 turns off and the grounding transistor Q22 turns on. Thus, the output OUT2 of the second-stage logic circuit section 2 remains low or goes to high, depending on the state of the input signals B1 through Bn supplied to the logic element 21.

As described above, the output OUT2 of the present semiconductor logic circuit is the AND of the output OUT1 and the operation result from the logic element 21.

Now, the operations of the semiconductor logic circuit are described below, assuming that the logic element 21 of the second-stage logic circuit section 2 is a specific logic circuit.

Figure 3:
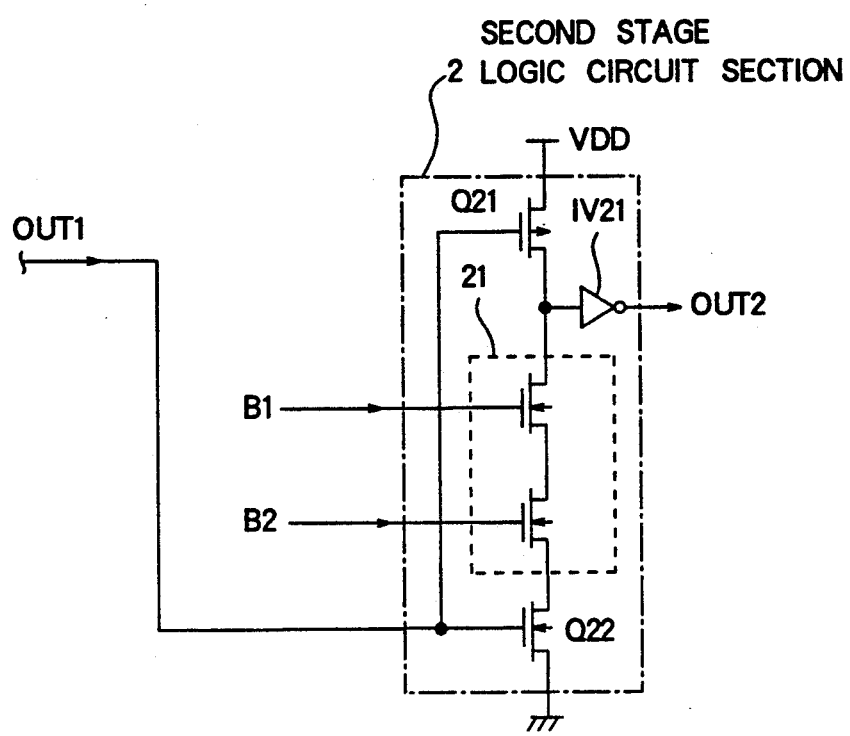
FIG. 3 is a circuit diagram showing an AND circuit is used as a logic element contained in a second-stage logic circuit section of the embodiment shown in FIG. 1.

FIG. 3 shows a configuration in which the logic element 21 is an AND circuit. For simplicity, the logic element 21 is assumed to receive input signals B1 and B2. The output OUT2 of the second-stage logic circuit section 2 is then expressed by a logical expression: OUT2=B1·B2·OUT1. This shows that the output OUT2 is the AND of the output OUT1 and the operation result from the logic element 21.

Figure 4:
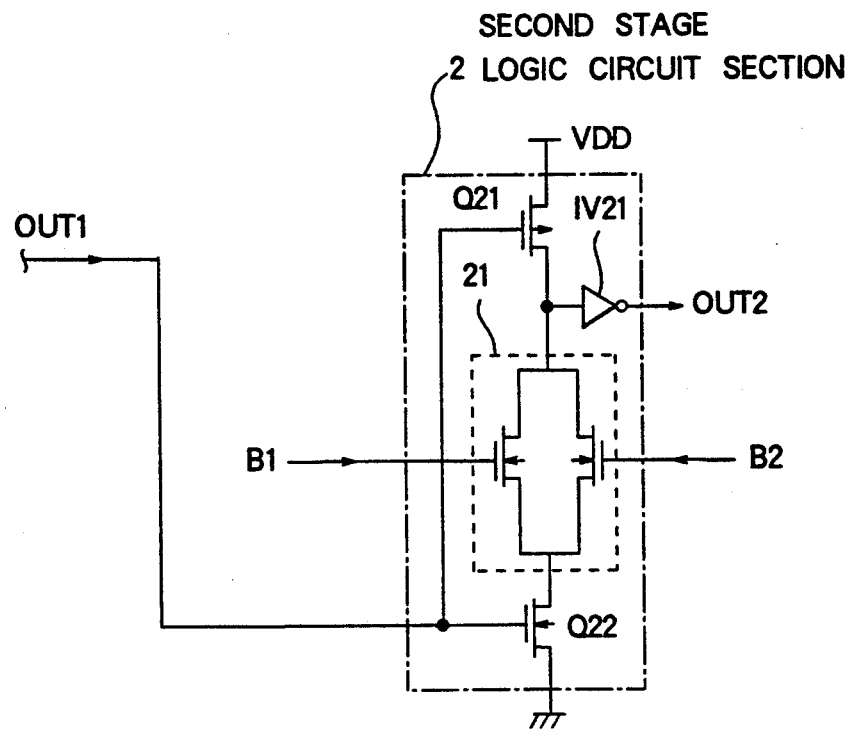
FIG. 4 is a circuit diagram showing an OR circuit is used as a logic element contained in a second-stage logic circuit section of the embodiment shown in FIG. 1.

FIG. 4 shows another configuration in which the logic element 21 is an OR circuit. For simplicity, the logic element 21 is assumed to receive input signals B1 and B2. The output OUT2 of the second-stage logic circuit section 2 is then expressed by a logical expression: OUT2=(B1+B2)·OUT1. This also shows that the output OUT2 is the AND of the output OUT1 and the operation result from the logic element 21.

Figure 5:
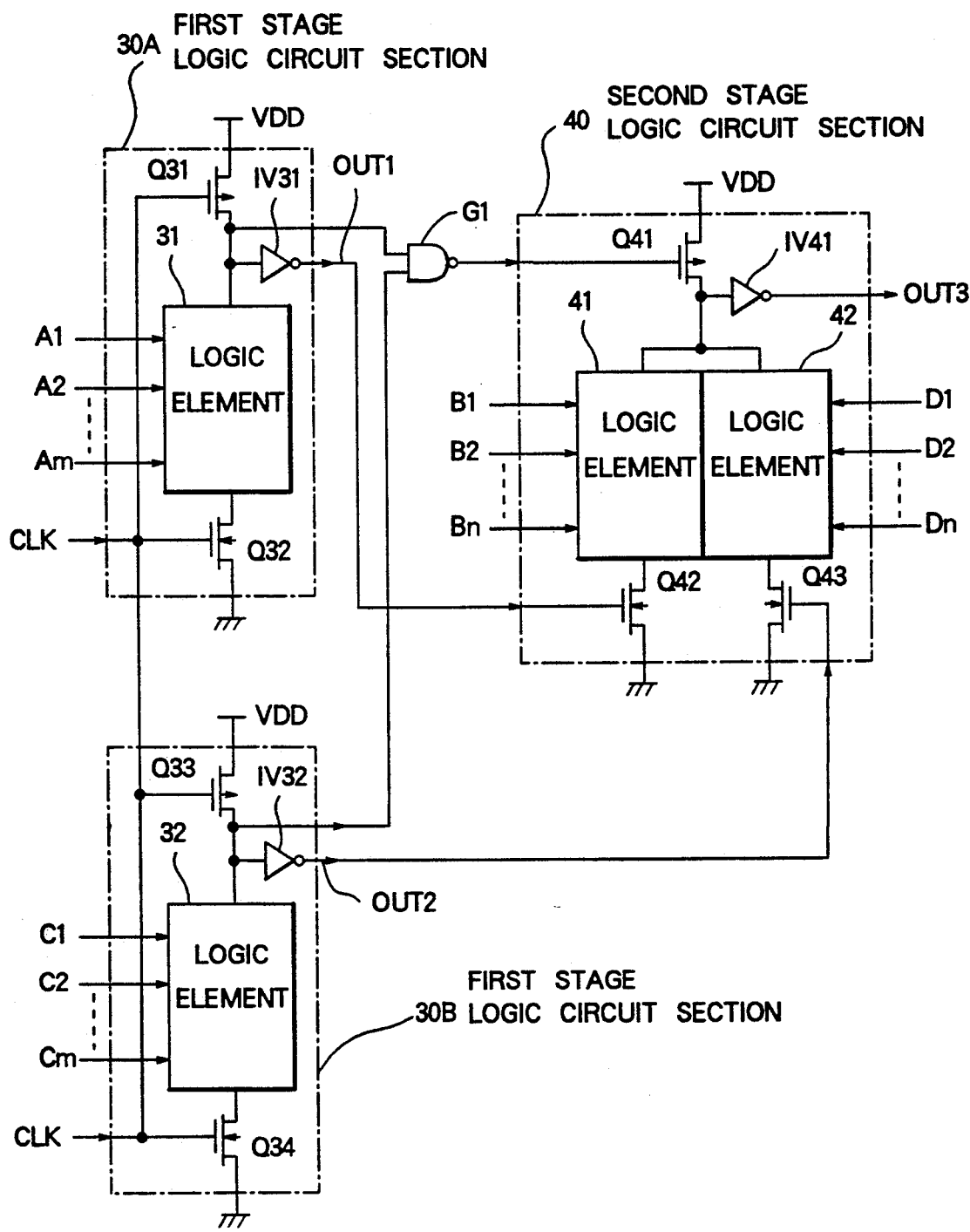
FIG. 5 is a block diagram showing the configuration of a semiconductor logic circuit according to another embodiment of the present invention.

FIG. 5 shows a semiconductor logic circuit according to another embodiment of the present invention. In the figure, the semiconductor logic circuit includes two first-stage logic circuit sections 30A and 30B, a NAND circuit G1, and a second-stage logic circuit section 40.

Each of the first-stage logic circuit sections 30A and 30B has the same configuration as the first-stage logic circuit section 1 shown in FIG. 1. That is, the first-stage logic circuit section 30A comprises of a logic element 31, a precharging transistor Q31, a first grounding transistor Q32, and an inverter IV31. The other first-stage logic circuit section 30B comprises of a logic element 32, a precharging transistor Q33, a first grounding transistor Q34, and an inverter IV32. The precharging transistors Q31 and Q33 are P-channel MOSFETs and the grounding transistors Q32 and Q34 are N-channel MOSFETs.

The precharging transistors Q31 and Q32 and the grounding transistors Q32 and Q34 receive a clock signal CLK at their gates, respectively. Each of the transistors turns on/off in response to the clock signal CLK.

The logic elements 31 and 32 include m number of transistors each having the gate to receive a first input signal A1, A2, ..., or Am and an input signal C1, C2, ..., or Cm, respectively. The logic elements 31 and 32 perform a given logic operation on the input signal A1, A2, ..., or Am and the input signal C1, C2, ..., or Cm and make the results available at their output ends. At the output ends of the logic elements 31 and 32, inverters IV31 and IV32 are provided to invert outputs of the logic elements 31 and 32 and the inverted outputs from the inverters IV31 and IV32 are outputs OUT1 and OUT2 of the first-stage logic circuit sections 31 and 32. In addition, the output ends of the logic elements 31 and 32, that is, the drains of the precharging transistors Q31 and Q33 are connected to the input of the NAND circuit G1 to perform a NAND operation on the output signals from the logic elements 31 and 32.

The second-stage logic circuit section 40 comprises of a second precharging transistor Q41, two logic elements 41 and 42, two second grounding transistors Q42 and Q43, and an inverter IV41. The precharging transistor Q41 and the grounding transistors Q42 and Q43 are a P-channel MOSFET and N-channel MOSFETs, respectively.

The precharging transistor Q41 has the gate connected to the output of the NAND circuit G1 and turns on/off in response to an output signal from the NAND circuit G1.

The grounding transistors Q42 and Q43 have the sources connected to the ground, respectively. The grounding transistor Q42 has the gate connected to the output OUT1 of the first-stage logic circuit section 30A and the grounding transistor Q43 has the gate connected to the output OUT2 of the first-stage logic circuit section 30B. The grounding transistors Q42 and Q43 turn on/off in response to output signals at the outputs OUT1 and OUT2.

The logic element 41 includes n number of transistors each having the gate to receive a second input signal B1, B2, ..., or Bn, and is connected to the drain of the grounding transistor Q42 at the grounding end and to the drain of the precharing transistor Q41 at the output end. The logic element 41 performs a given logic operation on the second input signal B1, B2, ..., or Bn and makes the result available at the output end. The logic element 42 includes n number of transistors each having the gate to receive a second input signal D1, D2, ..., or Dn, and is connected to the drain of the grounding transistor Q43 at the grounding end and to the drain of the precharing transistor Q41 at the output end. The logic element 42 performs a given logic operation on the second input signal D1, D2, ..., or Dn and makes the result available at the output end.

At the output ends of the logic elements 41 and 42, an inverter IV41 is provided to invert outputs of the logic elements 41 and 42 and the inverted output from the inverter IV41 is an output OUT3 of the second-stage logic circuit section 40.

The semiconductor logic circuit shown in FIG. 5 differs from the prior semiconductor logic circuits described above in that the NAND circuit G1 is provided to perform a NAND operation on the outputs from the logic elements 31 and 32 of the first-stage logic circuit sections 30A and 30B, that the sources of the grounding transistors Q42 and Q43 are connected directly to the ground to eliminate the necessity of providing a third grounding transistor in the second-stage logic circuit section 40, and that an output signal of the NAND circuit G1 is supplied to the gate of the precharging transistor Q41.

Now, the operations of the semiconductor logic circuit according to the second embodiment is described below.

While the clock signal CLK is low, the outputs OUT1 and OUT2 are low and the output of the NAND circuit G1 is low. Therefore, the grounding transistors Q42 and Q43 are off, the precharging transistor Q41 is on, and the output OUT3 is low.

When the clock signal CLK goes to high, the outputs OUT1 and OUT2 remain low or go to high, depending on the state of the input signals A1 through Am and C1 through Cm supplied to the logic elements 31 and 32. More specifically, if at least one of the outputs OUT1 and OUT2 goes to high, the output of the NAND circuit G1 goes to high and the precharging transistor Q41 turns off.

If the output OUT1 goes to high, the grounding transistor Q42 turns on and then the output OUT3 remains low or goes to high, depending on the state of the input signals B1 through Bn supplied to the logic element 41. If the output OUT2 goes to high, the same conditions will occur. If both the outputs OUT1 and OUT2 remain low, the grounding transistors Q42 and Q43 are still off, the precharging transistor Q41 is still on, and the output OUT3 remains low.

Thus, the output OUT3 of the semiconductor logic circuit is the OR between the AND of the output OUT1 and the operation result from the logic element 41 and the AND of the output OUT2 and the operation result from the logic element 42.

Now, the operations of the semiconductor logic circuit are described below, assuming that the logic elements 41 and 42 of the second-stage logic circuit section 40 are specific logic circuits.

Figure 6:
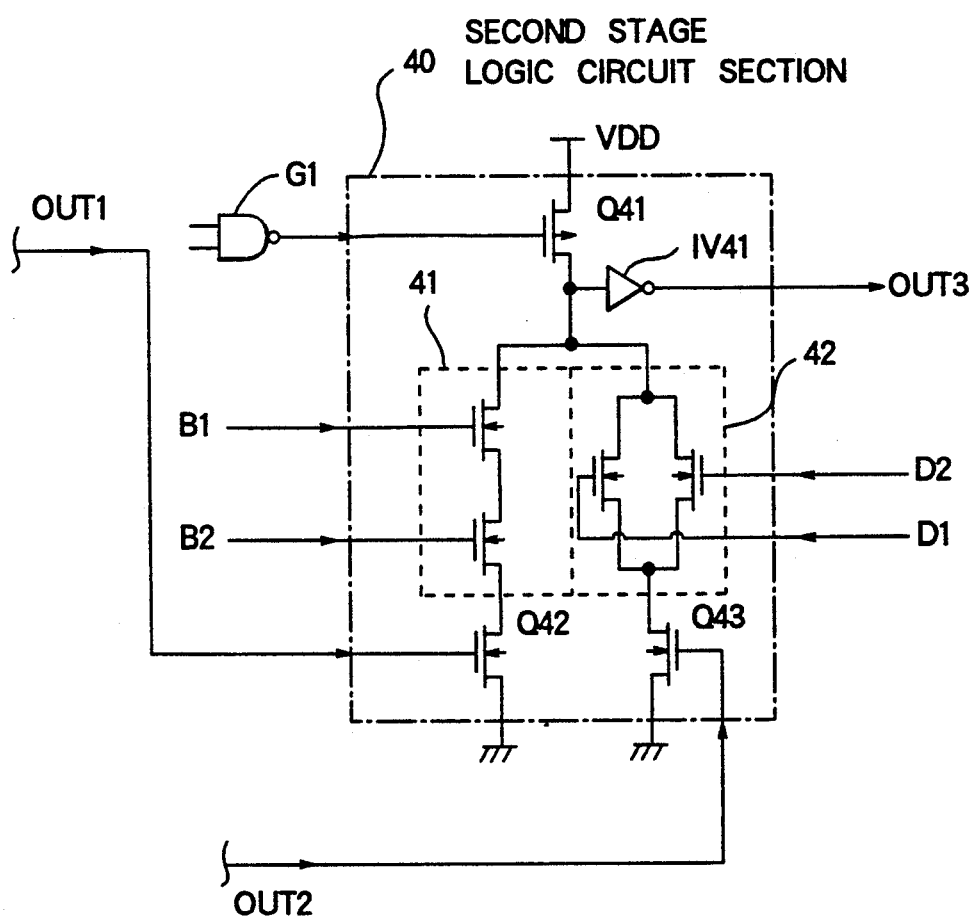
FIG. 6 is a circuit diagram showing an AND circuit and an OR circuit are used as logic elements contained in a second-stage logic circuit section of the embodiment shown in FIG. 5.

FIG. 6 shows a configuration in which the logic element 41 is an AND circuit and the logic element 42 is an OR circuit. For simplicity, the logic element 41 is assumed to receive input signals B1 and B2 and the logic element 42 is assumed to receive input signals D1 and D2. The output OUT3 of the second-stage logic circuit section 40 is then expressed by a logical expression: OUT3=(B1·B2·OUT1)+((D1+D2)·OUT2). This shows that the output OUT3 is the OR between the AND of the output OUT1 and the operation result from the logic element 41 and the AND of the output OUT2 and the operation result from the logic element 42.

It should be noted that, according to the first and second embodiments described above, the clock signals CLK are supplied to the precharging transistors Q11, Q31, and Q33 of the first-stage logic circuit sections 1, 30A, and 30B and to the gates of the grounding transistors Q12, Q32, and Q34, but not to the transistors of the second-stage logic circuit sections 2 and 40. This may require only a smaller circuit to generate the clock signals CLK. In addition, because these embodiments use a grounding transistor for the second-stage logic circuit sections 2 and 40, they can discharge electric charges for a shorter time and provide faster operations.

As described above in detail, the present invention requires the clock signals to be supplied to the transistors in the first-stage logic circuit section only, because the output signal of the first-stage logic circuit section is supplied to the gates of the precharging and grounding transistors in the second-stage logic circuit section. It should be appreciated that a smaller clock generator may work well for the present invention and can eliminate the necessity of providing an additional grounding transistor in the second-stage logic circuit section, resulting in faster operations of the second-stage logic circuit section.

It should be further appreciated that the present invention is not limited to the preferred embodiments described above and various changes and modifications may be made. For example, the semiconductor logic circuit may include three or more first-stage logic circuit sections. All such modifications as fall within the true spirit and scope of the invention should be covered by the appended claims.

What is claimed is:

1. A semiconductor logic circuit including:
   a first-stage logic circuit section and a second-stage logic circuit section;
   said first-stage logic circuit section comprising of a first precharging transistor, a first grounding transistor, and a first logic element;
   said first precharging transistor having the common terminal connected to a power terminal and receiving a clock signal at the input terminal;
   said first grounding transistor having the common terminal connected to the ground and receiving a clock signal at the input terminal;
   said first logic element including a number of transistors to receive first input signals at their input terminals and having the grounding end connected to the output terminal of said first grounding transistor and the output end connected to the output terminal of said first precharging transistor;
   said second-stage logic circuit section comprising of a second precharging transistor, a second grounding transistor, and a second logic element;
   said second precharging transistor having the common terminal connected to a power terminal and the input terminal connected to the output end of said first logic element;
   said second grounding transistor having the common terminal connected to said ground and the input terminal connected to the output end of said first logic element; and
   said second logic element including a number of transistors to receive second input signals at their input terminals and having the grounding end connected to the output terminal of said second grounding transistor and the output end connected to the output terminal of said second precharging transistor.

2. A semiconductor logic circuit according to the claim 1, wherein said first and second precharging transistors are P-channel FETs and said first and second grounding transistors are N-channel FETs.

3. A semiconductor logic circuit according to the claim 1, wherein said first-stage logic circuit section is provided with an inverter to invert an output signal of the first logic element, the output of said inverter is connected to the input terminal of the second precharging and grounding transistor in said second-stage logic circuit section, and said second-stage logic circuit section is provided with an inverter to invert an output signal of the second logic element.

4. A semiconductor logic circuit according to the claim 1, wherein the second logic element of said second-stage logic circuit section is an AND circuit to make the AND of the output from said first-stage logic circuit section and said second input signals available at said output end.

5. A semiconductor logic circuit according to the claim 1, wherein the second logic element of said second-stage logic circuit section is an OR circuit, and the output of said second-stage logic circuit section is AND logic between the output from said first-stage logic circuit section and the operation result from said second logic element.

6. A semiconductor logic circuit including:
a number of first-stage logic circuit sections, a logic gate circuit, and a second-stage logic circuit section;
each of said first-stage logic circuit sections comprising of a first precharging transistor, a first grounding transistor, and a first logic element;
said first precharging transistor having the common terminal connected to a power terminal and receiving a clock signal at the input terminal;
said first grounding transistor having the common terminal connected to the ground and receiving a clock signal at the input terminal;
said first logic element including a number of transistors to receive first input signals at their input terminals and having the grounding end connected to the output terminal of said first grounding transistor and the output end connected to the output terminal of said first precharging transistor;
said logic gate circuit having the input connected to the output end of the first logic element of each of said first-stage logic circuit sections;
said second-stage logic circuit section comprising of a second precharging transistor, a number of second grounding transistors, and a number of second logic elements;
said second precharging transistor having the common terminal connected to a power terminal and receiving an output signal of said logic gate circuit at the input terminal;
said second grounding transistors each having the common terminals connected to said ground and each input terminal connected to the output end of said first logic element of each of said first stage logic circuit sections; and
said second logic elements each including a number of transistors to receive second input signals at their input terminals and having each grounding end connected to each of the output terminals of said second grounding transistors and each output end connected to an output terminal of said second precharging transistor.

7. A semiconductor logic circuit according to the claim 6, wherein said first and second precharging transistors are P-channel FETs and said first and second grounding transistors are N-channel FETs.

8. A semiconductor logic circuit according to the claim 6, wherein said first-stage logic circuit section is provided with an inverter to invert an output signal of the first logic element, the output of said inverter is connected to the input terminal of the second grounding transistor in said second-stage logic circuit section, and said second-stage logic circuit section is provided with an inverter to invert an output signal of the second logic element.

9. A semiconductor logic circuit according to the claim 6, wherein the second logic elements of said second-stage logic circuit section are an AND circuit and an OR circuit.

* * * * *